(12) United States Patent
Stojetz et al.

(10) Patent No.: US 10,270,225 B2
(45) Date of Patent: Apr. 23, 2019

(54) SEMICONDUCTOR LASER ARRANGEMENT AND PROJECTOR

(71) Applicant: OSRAM Opto Semiconductors GmbH, Regensburg (DE)

(72) Inventors: Bernhard Stojetz, Wiesent (DE); Alfred Lell, Maxhütte-Haidhof (DE); Christoph Eichler, Donaustauf (DE); Andreas Löffler, Neutraubling (DE); André Somers, Obertraubling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/773,162

(22) PCT Filed: Nov. 2, 2016

(86) PCT No.: PCT/EP2016/076424
§ 371 (c)(1),
(2) Date: May 2, 2018

(87) PCT Pub. No.: WO2017/076903
PCT Pub. Date: May 11, 2017

(65) Prior Publication Data
US 2018/0323581 A1 Nov. 8, 2018

(30) Foreign Application Priority Data
Nov. 2, 2015 (DE) .................. 10 2015 118 715

(51) Int. Cl.
*H01S 5/00* (2006.01)
*H01S 5/40* (2006.01)
(Continued)

(52) U.S. Cl.
CPC .......... *H01S 5/4093* (2013.01); *H01S 5/0078* (2013.01); *H01S 5/026* (2013.01);
(Continued)

(58) Field of Classification Search
CPC ...... H01S 5/4093; H01S 5/026; H01S 5/2031; H01S 5/34333; H01S 5/4031;
(Continued)

(56) References Cited

U.S. PATENT DOCUMENTS

| 2001/0021209 A1* | 9/2001 | Onishi | H01S 5/4031 |
| | | | 372/43.01 |
| 2003/0058911 A1* | 3/2003 | Ebeling | H01S 5/426 |
| | | | 372/50.1 |

(Continued)

FOREIGN PATENT DOCUMENTS

| JP | H0818154 | 1/1996 |
| JP | 2001185811 A | 7/2001 |

OTHER PUBLICATIONS

Jain, F. et al., "P-38 Monolithic Integration of Red, Blue, and Green Lasers for Smart Projection Displays," University of Conneticut, Storrs, CT, XP 000657166, Mar. 23, 1995, 4 pages.

(Continued)

*Primary Examiner* — Kinam Park
(74) *Attorney, Agent, or Firm* — Slater Matsil, LLP (57) ABSTRACT

A semiconductor laser arrangement and a projector are disclosed. In an embodiment the semiconductor laser arrangement includes at least two electrically pumped active zones, each active zone configured to emit laser radiation of a different emission wavelength and a semiconductor-based waveguide structure, wherein the active zones are electrically independently operable of one another, wherein the active zones optically follow directly one another along a beam direction and are arranged in a descending manner with regard to their emission wavelengths, wherein at least in a region of a last active zone along the beam direction, a laser radiation of all active zones jointly runs through the waveguide structure, wherein at least the last active zone comprises a plurality of waveguides which are stacked one (Continued)

above the other and are oriented parallel to one another, wherein one of the waveguides is configured for the radiation emitted by the last active zone.

16 Claims, 4 Drawing Sheets (51) Int. Cl.
  H01S 5/20      (2006.01)
  H01S 5/10      (2006.01)
  H01S 5/022     (2006.01)
  H01S 5/026     (2006.01)
  H01S 5/343     (2006.01)
  H01S 5/323     (2006.01)
  H01S 5/028     (2006.01)
  H01S 5/42      (2006.01)

(52) U.S. Cl.
  CPC ........ *H01S 5/02252* (2013.01); *H01S 5/1028* (2013.01); *H01S 5/2018* (2013.01); *H01S 5/2031* (2013.01); *H01S 5/34333* (2013.01); *H01S 5/4031* (2013.01); *H01S 5/4087* (2013.01); *H01S 5/0071* (2013.01); *H01S 5/0287* (2013.01); *H01S 5/32325* (2013.01); *H01S 5/32341* (2013.01); *H01S 5/34326* (2013.01); *H01S 5/4043* (2013.01); *H01S 5/426* (2013.01); *H01S 2304/12* (2013.01)

(58) Field of Classification Search
  CPC .. H01S 5/4087; H01S 5/0071; H01S 5/32325; H01S 5/34326; H01S 5/1028; H01S 5/2018
  See application file for complete search history.

(56) References Cited

U.S. PATENT DOCUMENTS

| | | | | |
|---|---|---|---|---|
| 2005/0169337 A1* | 8/2005 | Downing | .............. | H01S 5/4006 372/50.1 |
| 2008/0056311 A1* | 3/2008 | Takeuchi | .............. | H01S 5/0612 372/20 |
| 2014/0133505 A1* | 5/2014 | Lindberg | .............. | H01S 5/0425 372/44.01 |
| 2015/0229107 A1* | 8/2015 | McLaurin | .............. | H01S 5/4093 372/45.01 |

OTHER PUBLICATIONS

XJ-V2 Casio Laser Projector, downloaded from http://www.casio.com/products/Projectors/Ecolite_Projectors/XJ-V2/c on Jan. 19, 2016, 2 pages.

* cited by examiner

SEMICONDUCTOR LASER ARRANGEMENT AND PROJECTOR

This patent application is a national phase filing under section 371 of PCT/EP2016/076424, filed Nov. 2, 2016, which claims the priority of German patent application 10 2015 118 715.9, filed Nov. 2, 2015, each of which is incorporated herein by reference in its entirety.

TECHNICAL FIELD

The invention relates to a semiconductor laser arrangement. Furthermore, the invention relates to a projector.

SUMMARY OF THE INVENTION

Embodiments provide a compact semiconductor laser arrangement which emits light of different colors, the emitted light having good beam-shaping properties.

According to at least one embodiment, the semiconductor laser arrangement is designed for emitting laser radiation. A coherence length of the laser radiation, as emitted by the semiconductor laser arrangement, is, for example, at least 1 µm or 1 mm or 10 mm. If radiation is emitted by the semiconductor laser arrangement in mutually different spectral regions, thus, the cited values for the coherence length are preferably valid for each individual spectral range and preferably also for the total emitted radiation.

According to at least one embodiment, the semiconductor laser arrangement comprises at least two electrically pumped active zones. Electrically pumped means in particular that the active zones are designed to emit laser radiation in the event of electrical energization. The laser radiation is generated by recombination of charge carriers in at least one semiconductor material of the active zones.

According to at least one embodiment, the active zones are part of at least one semiconductor layer sequence. The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein in each case $0 \leq n \leq 1$, $0 \leq m \leq 1$ and $n+m \leq 1$. However, the semiconductor layer sequence can comprise dopants and additional constituents. For the sake of simplicity, however, only the essential components of the crystal lattice of the semiconductor layer sequence are mentioned, that is Al, As, Ga, In, N or P, even if these can be partially replaced and/or supplemented by small quantities of other substances.

According to at least one embodiment, during operation the active zones are set up to generate laser radiation with emission wavelengths different from one another. For this purpose, the active zones have different material compositions, while the active zones can be based on the same material system, for example, on the material system AlInGaN in each case. It is likewise possible for the different active zones to be based on different material systems, for example, on the material system AlInGaN on the one hand and on the material system AlInGaP or AlInGaAs on the other hand.

According to at least one embodiment, the semiconductor laser arrangement has at least one waveguide structure, preferably exactly one waveguide structure. The waveguide structure is designed so that the laser radiation generated in the active zones during operation can be guided within the semiconductor laser arrangement. In particular, the waveguide structure is based on the principle of total reflection. In this case, the waveguide structure has at least one core material having a relatively high refractive index for the corresponding laser radiation. Said core material is surrounded by at least one layer made of a material having a lower refractive index.

According to at least one embodiment, the waveguide structure is a semiconductor-based structure. The waveguide structure partly or predominantly or completely consists of at least one semiconductor material. For example, the at least one semiconductor material of the waveguide structure accounts for a proportion of at least 90% or 95% or 99% of a total geometrical length of the waveguide structure.

According to at least one embodiment, the active zones are surrounded by the waveguide structure. For example, the active zones lie within a semiconductor material from which the waveguide structure is formed.

According to at least one embodiment, the active zones can be operated electrically independently of one another. In other words, an intensity of the laser radiation emitted from each of the active zones can be set independently of the other active zones.

According to at least one embodiment, the active zones are arranged in a descending manner along a beam direction in the semiconductor laser arrangement with regard to their emission wavelengths. This means that a first active zone then has the largest emission wavelength and a last one of the active zones, along the beam direction, has the smallest emission wavelength. In this way it can be prevented that a radiation of a preceding active zone is significantly absorbed in a downstream active zone. In other words, the active zones have an increasing band gap along the beam direction.

According to at least one embodiment, the beam direction in the semiconductor laser arrangement runs along a straight line. In particular, the beam direction runs without kinks towards a light out-coupling surface of the semiconductor laser arrangement.

According to at least one embodiment, the semiconductor laser arrangement comprises a plurality of resonators. Preferably, each of the active zones is located in a dedicated resonator. Boundary surfaces of the resonators are formed, for example, by facets of the at least one semiconductor layer sequence or by mirror layers. In this case, it is not ruled out that different active zones can share a specific mirror layer.

According to at least one embodiment, in the intended operation of the semiconductor laser arrangement, the waveguide structure is traversed jointly by the laser radiation of all active zones in the region of the last active zone along the beam direction. In other words, the waveguide structure is used at least in regions to collectively guide the different laser radiations which are generated in the different active zones.

In at least one embodiment, the semiconductor laser arrangement comprises at least two electrically pumped active zones. The active zones are designed to generate laser radiation with different emission wavelengths during operation. The laser radiation is generated by recombination of charge carriers in at least one semiconductor material on which the active zones are based. Furthermore, the semiconductor laser arrangement comprises a waveguide structure, preferably based on a semiconductor material. The active zones can be operated electrically independently of one another and are arranged in a descending manner along a beam direction in the semiconductor laser arrangement with regard to their emission wavelengths. The waveguide structure is jointly traversed by the laser radiation of all active zones at least in the region of the last active zone along the beam direction.

High-efficient light sources, which can be tuned in terms of their emission wavelength and which have a high luminance and a directed emission characteristic, are key components for rapidly growing markets, for example, for projectors for moving color images or for headlights with high range in motor vehicles. Light sources which are based on light-emitting diodes, LEDs for short, reach their limits with regard to their luminance.

By contrast, the superposition of laser light of different wavelengths generally requires complex optics for shaping and superimposing individual beams. Such complex optics can, however, only be used to a limited extent in portable projectors or in automobile headlights due to the restricted space. Complex optics are required, for example, when a plurality of semiconductor light sources are placed laterally next to one another, wherein the radiation from a specific light source passes the other light sources in each case. Light sources with fiber optics or light guides have comparatively large geometric dimensions.

A further way of implementing light sources of high luminance is to assign a luminous material to a laser light source. However, this is comparatively inefficient, for example, due to the losses in the wavelength conversion in the phosphor itself. In addition, the light emitted by the phosphor is incoherent, which makes beam shaping difficult or impossible in comparison with laser radiation. In addition, a light-emitting surface in the phosphor is enlarged by scattering. This results in a lower luminance and a lower etendue and thus also in a poorer beam shaping. In addition, when a phosphor is excited by a pump laser, an overall emitted color cannot be varied or can be varied only to a very limited extent.

In the laser arrangement described here, on the one hand, a complex optical system is dispensable. The laser arrangement described here can be realized without a phosphor. Thus, the semiconductor laser arrangement described here may be geometrically compact, tunable with regard to the emitted color and efficient.

According to at least one embodiment, each of the active zones is accommodated in a separate semiconductor laser chip. The semiconductor laser chips are, for example, edge-emitting lasers. A semiconductor laser chip is in particular a separately installed electronic component which can be mechanically self-supporting and can have its own external electrical connections. In particular, the various semiconductor laser chips do not have a common growth substrate and do not have a jointly grown active zone and/or semiconductor layer sequence.

The features specified for the separate semiconductor laser chips can equally apply to active zones which are accommodated in a common, in particular monolithic semiconductor layer sequence. The features for separate semiconductor laser chips are particularly preferred for active zones in a common semiconductor layer sequence when the semiconductor layer sequence has in each case a recess or a gap between active zones following one another along the beam direction. This means, for example, that the semiconductor layer sequence is partially or completely removed in the region between two adjacent active zones, for instance by means of etching or sawing or laser treatment. In particular at the level of the respective active zones, there is no continuous connection between the adjacent active zones through the semiconductor layer sequence itself along the beam direction.

If the active zones are part of a common semiconductor layer sequence, thus, after the semiconductor layer sequence has been grown, there is no change in the relative positions of the active zones relative to one another. For example, if the semiconductor layer sequence does not extend continuously over all active zones, a common growth substrate or a common replacement substrate which replaces a growth substrate as a supporting component is present.

According to at least one embodiment, the semiconductor laser chips are arranged along the beam direction on a straight line. Laser radiation generated in a preceding one of the semiconductor laser chips can thus be irradiated directly into the subsequent semiconductor laser chip, preferably without an intermediate optical system being present.

According to at least one embodiment, the semiconductor laser chips are arranged optically directly in succession. This can mean that no beam-shaping optics are located between adjacent semiconductor laser chips. In particular, no intermediate space or only a free-running section is located between adjacent semiconductor laser chips, for example, an intermediate space filled with a homogeneous material, or an evacuated region. The intermediate space between the semiconductor laser chips is preferably evacuated or filled with an inert gas, such as nitrogen or argon, or also with air or with oxygen or with combinations thereof. Alternatively, the semiconductor laser chips can be fastened to one another, for example, using a transparent material such as a glass or a ceramic.

According to at least one embodiment, the laser radiation of a preceding active zone is imaged and/or coupled into the waveguide of an active zone following in the beam direction via an intermediate optical system. For example, a converging lens is then located along the beam direction between the associated waveguides and/or active zones. This can apply with regard to all or also only with regard to some of the active zones.

According to at least one embodiment, each of the semiconductor laser chips comprises exactly one waveguide. The precisely one waveguide is preferably oriented parallel to the active zone of the corresponding semiconductor laser chip. The waveguides of the individual semiconductor chips can have different geometric dimensions, in particular different widths or thicknesses. It is equally possible for the waveguides of the different semiconductor laser chips to be matched to one another and to have the same width and/or thickness within the scope of the production tolerances. A width of the waveguides is defined, for example, by a ridge waveguide. In other words, the semiconductor laser chips can be semiconductor stripe lasers, also referred to as ridge lasers.

According to at least one embodiment, all waveguides of the semiconductor laser chips are arranged along a straight line. In particular, the waveguides are oriented in such a way that center lines or optical axes of the waveguides lie on this straight line.

According to at least one embodiment, the individual semiconductor laser chips or at least some of the semiconductor laser chips are arranged offset with respect to one another, in particular in the direction perpendicular to the beam direction and/or in the direction perpendicular to the growth direction of the associated semiconductor layer sequence. In this way it is possible, for example, for a monomode laser with a narrow waveguide to radiate eccentrically into a relatively wide waveguide of a broad stripe laser.

According to at least one embodiment, all semiconductor laser chips or at least some of the semiconductor laser chips are arranged in a tilted manner with respect to one another. As a result, it is possible for the semiconductor laser chips to couple into one another in a particularly loss-free manner, in particular at a Brewster angle.

According to at least one embodiment, the waveguides of the individual semiconductor laser chips together form the waveguide structure. In this case, the waveguide structure preferably consists of the waveguides of the semiconductor laser chips.

According to at least one embodiment, at least the last semiconductor laser chip along the beam direction has a plurality of waveguides stacked one above the other. Said waveguides are preferably oriented parallel to one another. Furthermore, the waveguides stacked one above the other form part of the waveguide structure, in particular together with waveguides of other semiconductor laser chips.

According to at least one embodiment, one of the waveguides of the last semiconductor laser chip is provided for the active zone of said last semiconductor laser chip. This means that the radiation generated by said last semiconductor laser chip is guided in one of the waveguides.

According to at least one embodiment, the at least one semiconductor laser chip that precedes the last semiconductor laser chip along the beam direction eradiates into a different one of the waveguides of the last semiconductor laser chip than the active zone of the last semiconductor laser chip itself. In this way, it is possible for each laser radiation to be eradiated with a specific emission wavelength in a particular waveguide, especially in the last semiconductor laser chip. An adaptation of the waveguides to the respectively guided radiation is thus possible.

According to at least one embodiment, the waveguides of the last semiconductor laser chip taken together, in the direction parallel to a growth direction of the associated semiconductor layer sequence, have an extent of at most 10 μm or 4 μm or 2 μm. Alternatively or additionally, this extent is at least 0.1 μm or 0.4 μm or 1 μm or 1.5 μm. In the direction perpendicular to the growth direction and in the direction perpendicular to the beam direction, the extent of the waveguides is, for example, at least 0.5 μm or 2 μm or 10 μm and/or at most 500 μm or 100 μm or 20 μm. In other words, the extent of the waveguides can be comparatively small. In particular, this extent is smaller than a mean pixel size in conventional representations. For example, in the case of a 4 k-HD projector with a horizontal projection length of 1 m, a resolution per pixel is approximately 250 μm. An extent of the waveguide structure is thus particularly preferably so small that an imaging of the radiation emitted from the different waveguides has no influence on an image quality or on the representation of image points.

According to at least one embodiment, a number of waveguides increases monotonically or strictly monotonically along the beam direction. This means that, for example, precisely one waveguide is assigned to the first active zone along the beam direction, two waveguides are assigned to the second active zone and as many waveguides as there are active zones are assigned to the last active zone. The assignment preferably applies in the direction parallel to a growth direction of a semiconductor layer sequence in which the respective active zone is located. If a plurality of waveguides are associated with an active zone, said waveguides are preferably stacked one on top of the other along the growth direction.

According to at least one embodiment, a distance between radiation exit surfaces and/or between facets of adjacent semiconductor laser chips is at most 100 μm or 50 μm or 25 μm. In particular, it is possible for the facets and/or for the radiation exit surfaces to touch each other. In this case, the various semiconductor laser chips are arranged in an abutting manner.

According to at least one embodiment, at least two of the active zones or all active zones are produced on a common growth substrate. In this case, the active zones are preferably based on the same material system. An emission wavelength is set by a material composition of the active zones, for example, by a content of aluminum and/or indium.

According to at least one embodiment, a relative difference between at least two of the emission wavelengths is at least a factor of 1.05 or 1.1 or 1.15 or 1.2. In particular, different colored light is generated by the individual active zones. The relative difference between the emission wavelengths is preferably not an integer multiple. In this way, resonances between the active zones can be avoided.

According to at least one embodiment, at least two or all of the active zones lie in a common plane. The common plane is preferably oriented perpendicular to a growth direction of the semiconductor layer sequence which contains at least one or all of the active zones.

According to at least one embodiment, in which at least two or all of the active zones are integrated in a single semiconductor layer sequence, the waveguide structure extends with a constant extent and along a straight line over the at least two or over all active zones. In this case, preferably only exactly one waveguide is present in the direction perpendicular to the active zones. The waveguide structure can be a continuous, uninterrupted structure. Alternatively, it is possible for the waveguide structure between adjacent active zones to be interrupted only by a wavelength-selective reflective structure.

According to at least one embodiment, at least two or all of the active zones are arranged within one semiconductor layer sequence, wherein the active zones are arranged stacked one on top of the other along a growth direction of the semiconductor layer sequence. In this case, the waveguide structure preferably has only exactly one waveguide. The waveguide and the waveguide structure are oriented parallel to the growth direction of the semiconductor layer sequence. In this case, the semiconductor laser arrangement is preferably a surface-emitting laser, also referred to as a vertical cavity surface emitting laser or VCSEL. The individual active zones are preferably grown monolithically on top of one another and are connected to one another, for example, by tunnel diodes or by electrical contact layers which can be controlled independently of one another.

According to at least one embodiment, a wavelength-selective mirror and/or a wavelength-selective optical grating is located between adjacent active zones. By means of such mirrors and/or gratings, a reflectivity of resonators for the respective active zones can be set. The mirror and/or the grating can directly adjoin one or two of the active zones or can also be entirely spaced apart and separated from the active zones. The mirror and/or the grating are preferably attached directly to at least part of the waveguide structure or else are partially or completely introduced into the associated semiconductor layer sequence, for instance by etching trenches and possible filling with dielectric and/or semiconducting material.

According to at least one embodiment, the waveguide structure consists of one or more semiconductor materials. Preferably, optionally present wavelength-selective mirrors and/or optical gratings are not taken into account during this observation. If such mirrors and/or gratings are present, it is possible that they also comprise at least one semiconductor material or consist of at least one semiconductor material.

Semiconductor materials are understood to mean, in particular, silicon and germanium and also compound semiconductors such as III-V semiconductor materials or II-VI semiconductor materials. In addition, such gratings can be made of a dielectric material, in particular an oxide or nitride such as aluminum oxide, tantalum oxide, silicon oxide, hafnium oxide, titanium oxide, niobium oxide, zirconium oxide, rhodium oxide, aluminum nitride, silicon nitride or aluminum oxinitride.

According to at least one embodiment, the semiconductor laser arrangement is free of phosphors and/or free of optically pumped laser structures. In other words, radiation is then generated in the semiconductor laser arrangement exclusively by the recombination of electronically excited charge carriers.

According to at least one embodiment, the semiconductor laser arrangement comprises one or more active zones for generating blue light. Blue light in particular denotes a radiation having a dominant wavelength of at least 420 nm or 440 nm and/or of at most 480 nm or 470 nm.

According to at least one embodiment, the semiconductor laser arrangement comprises one or more active zones which are designed to generate green light. Green light in particular means radiation having a dominant wavelength of at least 505 nm or 515 nm and/or of at most 540 nm or 530 nm.

According to at least one embodiment, the semiconductor laser arrangement comprises one or more active zones for generating red light. Red light means that a dominant wavelength of the associated radiation is, for example, at least 600 nm or 610 nm and/or at most 680 nm or 650 nm.

As far as ultraviolet radiation is concerned, reference is made in particular to the wavelength range from at least 300 nm or 340 nm and/or up to at most 400 nm or 380 nm. Near-infrared radiation, in particular, designates wavelengths of at least 700 nm or 800 nm to at most 1600 nm or 1450 nm.

Furthermore, a projector is specified. The projector comprises at least one semiconductor laser arrangement as indicated in connection with one or more of the above-mentioned embodiments. Features of the semiconductor laser arrangement are therefore also disclosed for the projector and vice versa.

According to at least one embodiment, the projector is provided for projecting variable images, in particular color images. For example, the projector is a so-called pico projector which can be used as a portable handheld device. In particular, videos or image sequences can be displayed with the projector. It is likewise possible for such RGB laser modules to be used for illuminating conventional liquid crystal displays, as used in conventional beamers, for example. In this way, a higher efficiency can be achieved since the colors of the lasers can be precisely matched to the liquid crystal pixels.

In at least one embodiment, the projector comprises at least one, in particular exactly one, semiconductor laser arrangement and at least one imaging optical system. The imaging optical system can have a lens or a lens system for adapting the divergence of the radiation emitted by the semiconductor laser arrangement. It is likewise possible for the imaging optical system to have a direction-defining element such as an adjustable mirror or micromirror for scanning image points of an image to be generated.

According to at least one embodiment, the projector is designed to emit laser radiation having an average luminous flux of at least 10 lm or 20 lm or 30 lm.

According to at least one embodiment, the semiconductor laser arrangement occupies only a small volume in the projector. For example, the semiconductor laser arrangement can be fitted in a volume of at most 12 mm×5 mm×5 mm or at most 10 mm×3 mm×3 mm or at most 3 mm×2 mm×2 mm. Preferably, this volume is only at most 2 mm×1.2 mm×1.2 mm.

Apart from in projectors, semiconductor laser arrangements described here can also be used in headlights, for example, for motor vehicles. In this case, it is possible for the headlight to emit white light with an adjustable white tone of color. Likewise, in the motor vehicle's exterior region, colored light can be generated by means of a semiconductor laser arrangement described here, for example, for turn indicators, brake lights or decoration illumination. In addition, colored or white light can be generated in the interior region of the motor vehicle by means of such a semiconductor laser arrangement. The same applies to rail vehicles, aircrafts or ships.

Furthermore, it is possible for semiconductor laser arrangements described here to be used in a tool for material processing. In this case, for example, an active zone emits ultraviolet radiation or blue light and a further active zone emits near-infrared or infrared light. In this way, for example, a tool for welding copper or gold can be realized.

Furthermore, semiconductor laser arrangements described here can be used in an infrared laser with a green laser as the target laser. Semiconductor laser arrangements described here can also be used for signal transmission, for example, in wavelength multiplexing. The use of semiconductor laser arrangements in LIDAR applications is also possible, in order to achieve an increased range by means of adapted wavelengths, for example, in fog.

Finally, semiconductor laser arrangements described here can be used for disinfection and/or spectroscopy, for example, by combining different emission wavelengths in the ultraviolet spectral range and/or in the infrared spectral range.

BRIEF DESCRIPTION OF THE DRAWINGS

In the following, laser arrangements described here and projectors described here are explained in more detail with reference to the drawing on the basis of exemplary embodiments. Identical reference signs indicate the same elements in the individual figures. In this case, however, no relationships to scale are illustrated; rather, individual elements can be represented with an exaggerated size in order to afford a better understanding.

In the figures.

DETAILED DESCRIPTION OF ILLUSTRATIVE EMBODIMENTS

Figure 1:
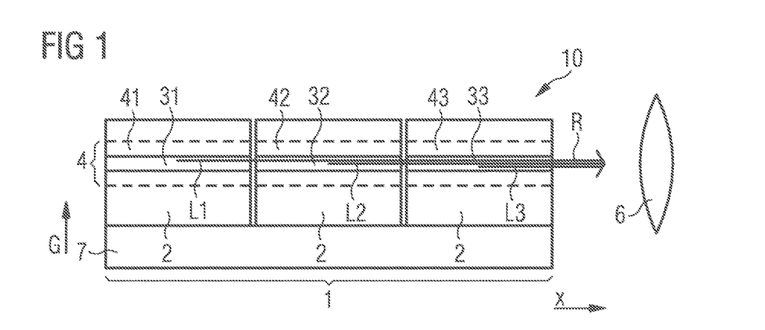
FIGS. 1 to 8 show schematic sectional representations of exemplary embodiments of projectors described here with semiconductor laser arrangements described here.

FIG. 1 shows an exemplary embodiment of a projector 10. The projector 10 comprises a semiconductor laser arrangement 1 and an imaging optical system 6. The imaging optical system 6 comprises collimating optics in the form of a converging lens.

The semiconductor laser arrangement 1 has a support 7. Three semiconductor laser chips 2 are mounted on the support 7. The semiconductor laser chips 2 each comprise an active zone 31, 32, 33 and a waveguide 41, 42, 43. In total, a laser radiation R is emitted by the semiconductor laser arrangement 1.

A radiation having an emission wavelength L1 is generated in the active zone 31. The radiation having the emission wavelength L1 is, for example, red light. Said radiation having the wavelength L1 is guided within the semiconductor laser chip 2 that comprises the active zone 31 in the waveguide 41. The active zone 31, as well as the other active zones 32, 33, is located in a not separately drawn resonator. Correspondingly, radiation having the emission wavelength L2, for example, green light, is emitted in the active zone 32, and in the active zone 33 a radiation having the emission wavelength L3, for example, blue light, is generated.

The radiation emitted in the active zone 31 leaves the associated semiconductor laser chip 2 in the direction towards the adjacent semiconductor laser chip 2 and enters the waveguide 42 of the semiconductor chip 2 with the active zone 32. The radiations having the emission wavelengths L1 and L2 are thus guided in the waveguide 32. These radiations L1, L2 subsequently enter the semiconductor laser chip 2 with the active zone 33. Thus, the radiations having the emission wavelengths L1, L2, L3 are jointly guided in the waveguide 43 and are jointly coupled out of the semiconductor laser arrangement 1.

Consequently, in the intended use the radiation R exits from the semiconductor laser arrangement 1 only at a single region. A collimation and beam shaping is thereby possible by means of a comparatively simple imaging optical system 6, for example, by means of a single converging lens. Optionally, as well as in all other exemplary embodiments, the imaging optical system 6 can include an aperture for preventing scattered light from leaving the projector 10.

In other words, the semiconductor laser chips 2 are arranged optically directly one behind the other along a beam direction x within the semiconductor laser arrangement 1 and couple the generated radiation directly into the subsequent semiconductor laser chip 2. All generated radiation components are thus emitted at the same time from the same waveguide 43 towards an outside area.

A distance between the adjacent semiconductor laser chips 2 is preferably very small, for example, smaller than 10 μm. In contrast to the illustration, the semiconductor laser chips 2 preferably abut one another, so that there is no or no significant distance between the adjacent semiconductor laser chips 2. Furthermore, the individual semiconductor laser chips 2 and thus the active zones 31, 32, 33 can be controlled electrically independently of one another.

Further components of the projector 10, such as power supply lines, control electronics or a housing, are not drawn in each case in order to simplify the illustration.

Figure 2:
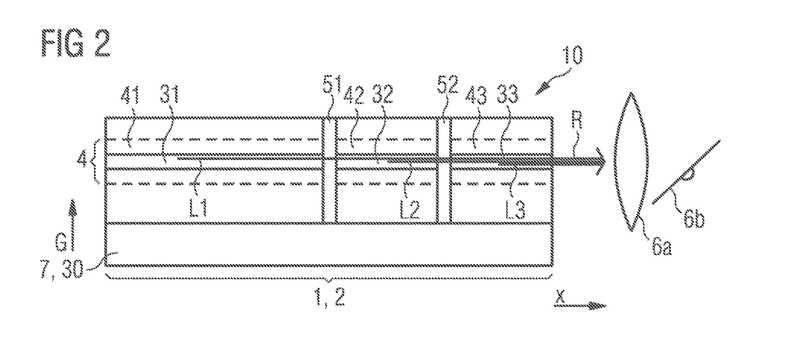

In the exemplary embodiment of FIG. 2, the semiconductor laser arrangement 1 of the projector 10 is formed only from a single semiconductor laser chip 2. The semiconductor laser chip 2 comprises a growth substrate 30, which also functions as the support 7. Proceeding from the growth substrate 30, semiconductor layer sequences are provided for the active zones 31, 32, 33 along a growth direction G, in particular epitaxially. As in FIG. 1, according to FIG. 2 the waveguides 41, 42, 43, which together form the waveguide structure 4, run in a straight line and at a constant distance from the growth substrate 30.

A wavelength-selective mirror 51 is located between adjacent active zones 31, 32, 33. The radiation having the wavelength L1 passes through the mirror 51, the radiations having the wavelengths L1, L2 pass through the mirror 52. The mirrors 51, 52 are formed, for example, as dielectric mirrors having a layer sequence having layers of alternately high and low refractive indices. It is likewise possible for the mirrors 51, 52 to be designed as Bragg gratings.

According to FIG. 2, as is also possible in all other exemplary embodiments, the imaging optical system 6 comprises a directional component 6b, in addition to the collimating optical system 6a. The component 6b is, for example, a movable micromirror by means of which individual pixels of an image to be generated can be projected.

Figure 3:
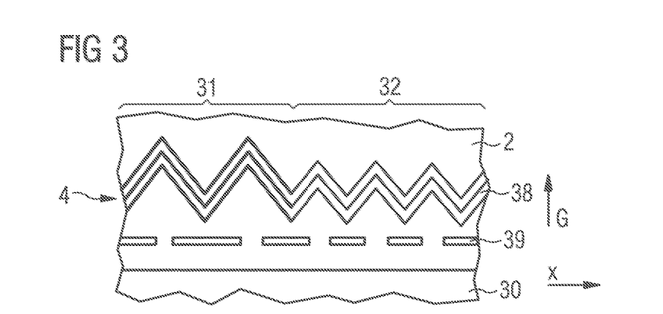

FIG. 3 shows a detail from a semiconductor laser chip 2 in which the active zones 31, 32 are grown in a continuous manner. The associated semiconductor layer sequence comprises a mask layer 39, for instance made of silicon dioxide. The mask layer 39 has openings of different sizes, from which pyramid-shaped structures with accordingly different sizes grow.

The semiconductor layer sequence is preferably based on the material system AlInGaN. The different sizes of the pyramids also result in different growth conditions on the pyramids. As a result, quantum well structures 38 with different thicknesses are formed on the pyramids. Different emission wavelengths can thus be obtained in the active zones 31, 32. Such a semiconductor laser chip 2 can be used, for example, in the exemplary embodiment according to FIG. 2, wherein the mirrors 51, 52 are preferably introduced subsequently.

Figure 4:
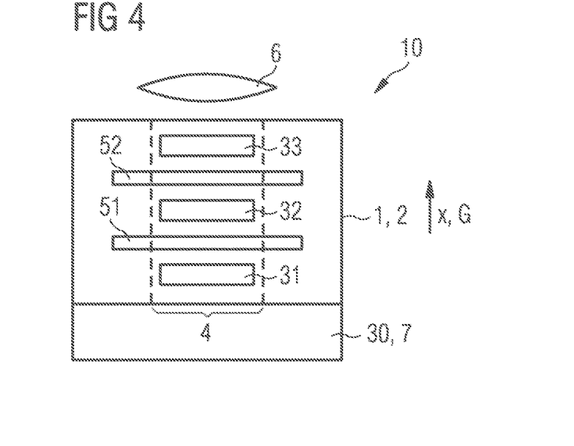

A further exemplary embodiment is shown in FIG. 4. The semiconductor laser arrangement 1 is formed from a single semiconductor laser chip 2. The active zones 31, 32, 33 are monolithically integrated in a semiconductor layer sequence and follow one another along the growth direction G. The growth direction G is at the same time the beam direction x. Adjacent active zones 31, 32, 33 are connected to one another, for example, by tunnel diodes. The mirrors 51, 52 are located between adjacent active zones 31, 32, 33. The waveguide structure 4 extends continuously over all active zones 31, 32, 33 and runs parallel to the growth direction G.

Particularly preferably, the active zones 31, 32, 33 can be electrically controlled individually. This can be achieved, for example, in that the associated semiconductor layer sequence is partially removed, for example, by etching, not shown, so that separate electrical contacts can be attached to the associated active zones 31, 32, 33.

Figure 5:
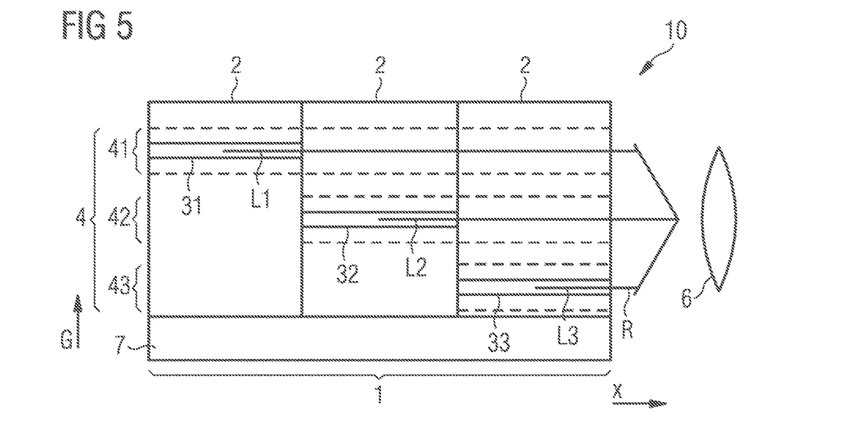

In the exemplary embodiment of FIG. 5, a plurality of semiconductor laser chips 2 are present which abut directly against each other and which are mounted on the support 7 without gaps. At least the semiconductor laser chips 2 with the active zones 32, 33 have a plurality of waveguides 41, 42, 43 which are arranged stacked one on top of the other along the growth direction G. As in all other exemplary embodiments, along the growth direction G a thickness of the individual waveguides 41, 42, 43 is preferably at most twice the respective vacuum emission wavelength L1, L2, L3. In this way, an extent of the waveguide structure 4 along the growth direction G is, for example, at most 20 μm.

For each radiation having the emission wavelengths L1, L2, L3 thus its own plane is provided parallel to the carrier 7, in which the respective radiation is guided. The individual waveguides 41, 42, 43 can thus be optimized for the respective emission wavelengths L1, L2, L3. Due to the very small extension of the waveguide structure 4 along the growth direction G, the total emitted laser radiation R can thus appear as homogeneously mixed light in a projected image point.

Deviating from the illustration in FIG. 5, it is also possible for the laser chips 2 with the active zones 31, 32 to each have all waveguides 41, 42, 43. However, only the waveguides 41, 42, 43 shown in FIG. 5 are preferably used functionally as waveguides.

If the emission wavelengths L1, L2, L3 are only slightly different, it is possible for a plurality of active zones to be grown on top of one another in the waveguide structure 4. Laterally, individual active zones can then be deactivated or turned off, for example, by means of ion implantation or by targeted material damage with laser irradiation in accordance with stealth dicing. Alternatively, the individual waveguides, in which no radiation is generated, can also be grown without an active zone, as is also shown in FIG. 5.

In FIG. 5, the waveguides 41, 42, 43 stacked one above the other are realized in three different semiconductor laser chips 2. Such a stacking of the waveguides 41, 42, 43 is equally possible in only one single semiconductor laser chip 2, analogously to the exemplary embodiment of FIG. 2.

Figure 6:
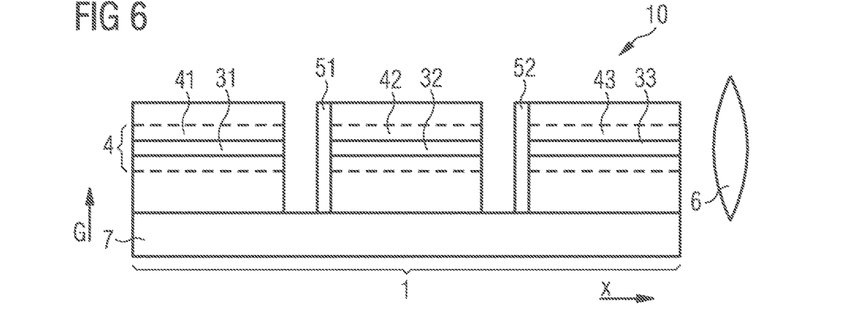

In the exemplary embodiment of FIG. 6, between the individual active zones 31, 32, 33 the mirrors 51, 52 are located. The mirrors 51, 52 are, for example, only in contact with one of the active zones 32, 33 and/or with one of the waveguides 42, 43.

Figure 11:
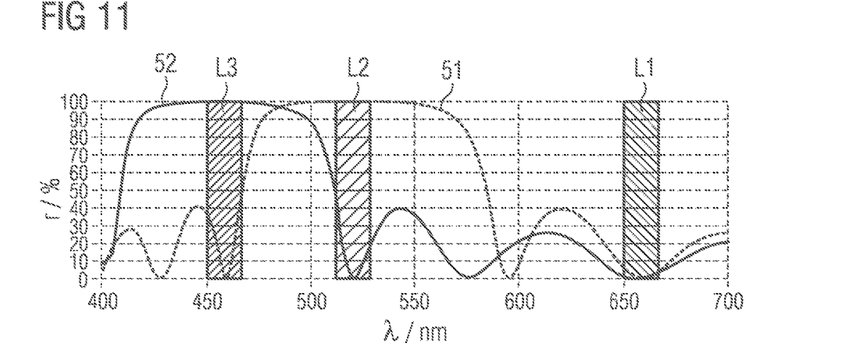
FIG. 11 shows a schematic representation of spectral properties of mirrors for semiconductor laser arrangements described here.

A reflectivity r in percent of the mirrors 51, 52 is preferably designed with regard to a wavelength λ in nm, as illustrated in FIG. 1i. The two mirrors 51, 52 are thus transmissive to the emission wavelength L1, which lies in the red spectral range. The mirror 52 is additionally transmissive to the emission wavelength L2 lying in the green spectral range. The mirror 52 thus only reflects the emission wavelength L3 lying in the blue spectral range.

Figure 7:
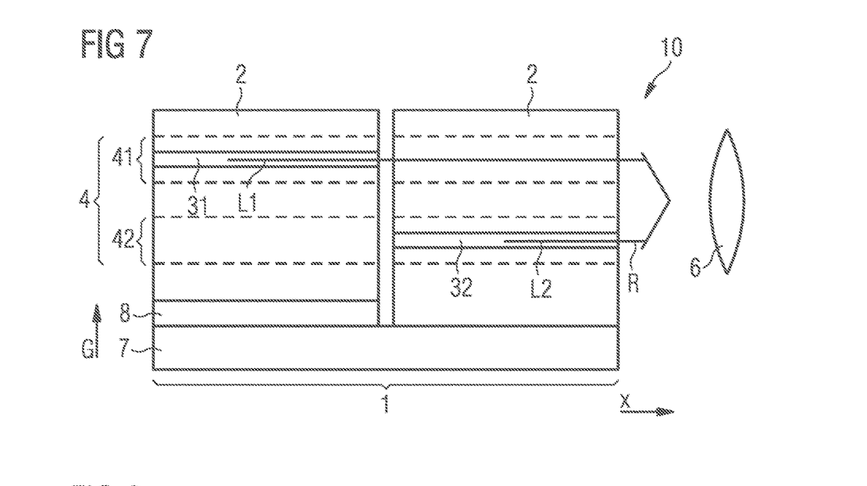

In the exemplary embodiment of FIG. 7, the waveguides 41, 42 are present in both semiconductor laser chips 2. However, only the waveguide 42 located closer to the support 7 is functionally used in the semiconductor laser chip 2 with the active zone 32. A control photodiode is provided on a side of the semiconductor laser chips 2 facing away from the imaging optical system 6; thus, the waveguide 42 which is not provided with an active zone can also serve to direct radiation with the wavelength L2 to said control photodiode. The same can apply in the exemplary embodiment of FIG. 5.

The emission wavelength L1 is, for example, in the infrared or near-infrared spectral range. The semiconductor laser chip 2 with the active zone 31 can be a high-power laser diode which is used for material processing, for example, for melting or welding. The semiconductor laser chip 2 having the active zone 32 is designed, for example, to generate ultraviolet or blue radiation having the emission wavelength L2, in order to ensure efficient material processing for instance of gold or copper. The processing of aluminum is also possible with such semiconductor laser arrangements 1. Alternatively, a combination of green laser light with blue and/or ultraviolet laser light can also be used, in particular for material processing.

As in all other exemplary embodiments, for an adaptation of a distance of the waveguides 41, 42 to the support 7 it is possible for an intermediate carrier 8 to be present. Such an intermediate carrier 8 can also function as an additional cooling component.

Figure 8:
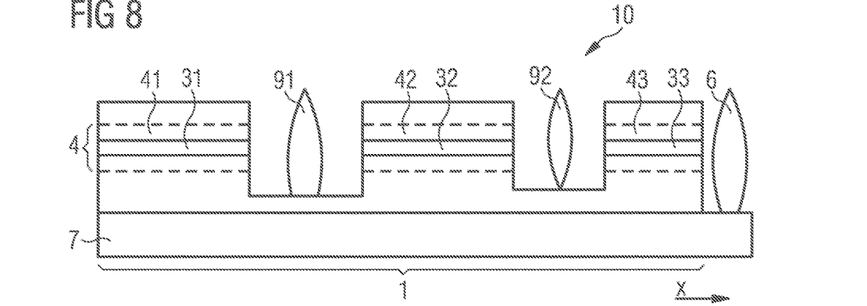

In the exemplary embodiment of FIG. 8, between adjacent active zones 31, 32, 33 there is in each case an intermediate optical system 91, 92. Via the intermediate optical systems 91, 92, the laser radiation of an active zone 31 preceding in the beam direction x, 32 is coupled or imaged into the following waveguide 42, 43. The optical systems 6, 91, 92 are preferably fixedly connected to the support 7, as can also be the case in all other exemplary embodiments.

Figure 9:
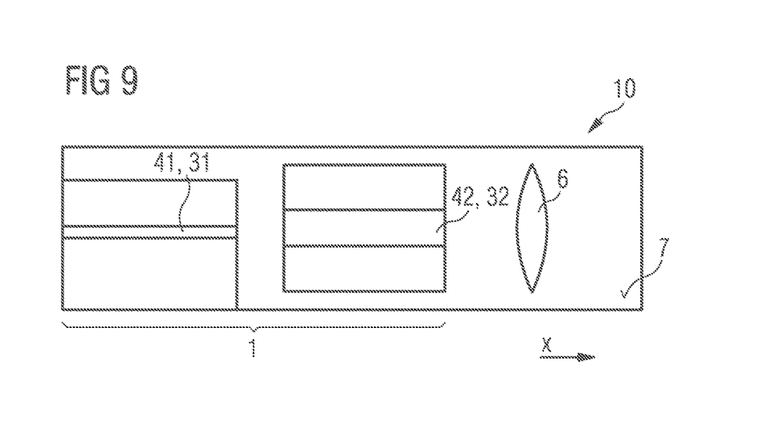
FIGS. 9 and 10 show schematic plan views of exemplary embodiments of projectors described here with semiconductor laser arrangements described here.

According to the plan view of FIG. 9, the semiconductor laser arrangement 1 has a narrow waveguide 41, for example, for monomode operation. The radiation from this narrow waveguide 41 is coupled into a broad stripe laser with the relatively wide waveguide 42. The broad waveguide 42 is preferably designed for multimode operation. In this case, the narrow waveguide 41 can be arranged eccentric to the wide waveguide 42, that is to say can be arranged displaced in the direction perpendicular to the beam direction x relative to a central axis of the wide waveguide 42.

Figure 10:
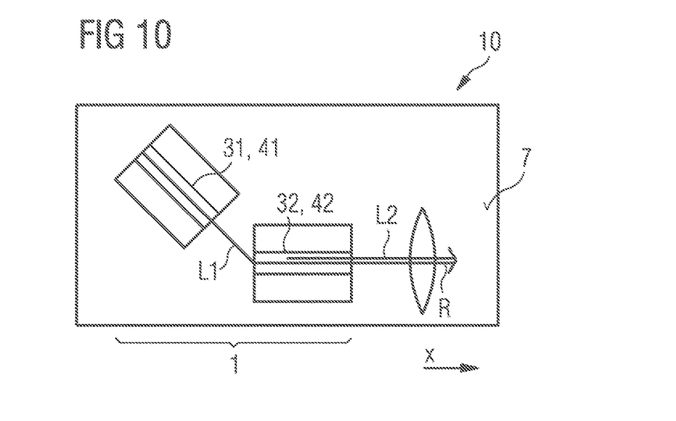

FIG. 10 shows that the waveguides 41, 42 are not arranged parallel to one another, but at an angle. Thus, the laser radiation from the active zone 31 can be efficiently coupled into the waveguide 42 at a Brewster angle.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. A semiconductor laser arrangement comprising:
at least two electrically pumped active zones, each active zone configured to emit laser radiation of a different emission wavelength during operation by recombination of charge carriers in at least one semiconductor material; and
a semiconductor-based waveguide structure,
wherein the active zones are electrically independently operable of one another,
wherein the active zones follow directly one another optically along a beam direction along a straight line and are arranged in the semiconductor laser arrangement in a descending manner with regard to their emission wavelengths,
wherein at least in a region of the last active zone along the beam direction, a laser radiation of all active zones jointly runs through the waveguide structure,
wherein at least the last active zone comprises a plurality of waveguides which are stacked one above the other and are oriented parallel to one another, the waveguides being part of the waveguide structure,
wherein one of the waveguides is configured for the radiation emitted by the last active zone, the at least one active zone that precedes the last active zone radiates into a different one of the waveguides than the last active zone,
wherein the waveguides which are assigned to the last active zone, taken together in the direction perpendicular to the beam direction and viewed in cross-section, have an extent of at most 10 μm, and
wherein the waveguide structure is configured to guide the laser radiation generated during operation in the active zones by internal total reflection so that the waveguides in each case comprise a core material having a high refractive index for the corresponding laser radiation and the core material is surrounded by at least one layer made of a material having a lower refractive index.

2. The semiconductor laser arrangement according to claim 1, wherein each of the active zones is accommodated in a separate edge-emitting semiconductor laser chip.

3. The semiconductor laser arrangement according to claim 2, wherein precisely one of the semiconductor laser chips has exactly one waveguide.

4. The semiconductor laser arrangement according to claim 2,
wherein at least a last semiconductor laser chip comprises a plurality of stacked waveguides which are aligned parallel to one another,
wherein the stacked waveguides are part of the waveguide structure,
wherein one of the waveguides is provided for the active zone of the last semiconductor laser chip,
wherein the at least one semiconductor laser chip preceding the last semiconductor laser chip radiates into a different one of the waveguides than the active zone of the last semiconductor laser chip, and
wherein the waveguides of the last semiconductor laser chip, taken together in the direction perpendicular to the beam direction and viewed in cross-section, have an extent of at most 4 µm.

5. The semiconductor laser arrangement according to claim 2,
wherein a distance between at least one of radiation exit surfaces or facets of adjacent semiconductor laser chips is at most 50 µm, and
wherein a space between the adjacent semiconductor laser chips is free of a waveguide for the laser radiation.

6. The semiconductor laser arrangement according to claim 1,
wherein all active zones are produced on a common growth substrate, and
wherein a relative difference between at least two of the emission wavelengths is at least a factor of 1.05.

7. The semiconductor laser arrangement according to claim 6, wherein all active zones, along a growth direction of a semiconductor layer sequence with the active zones, are stacked one above the other so that no two active zones are located at the same height in the direction parallel to the growth direction.

8. The semiconductor laser arrangement according to claim 1, wherein a number of the waveguides, which are assigned to the respective active zone in the direction parallel to a growth direction of a semiconductor layer sequence, increases in a strictly monotonic manner along the beam direction.

9. The semiconductor laser arrangement according to claim 6, wherein precisely one of the waveguides extends over all active zones with a constant extent and along a straight line.

10. The semiconductor laser arrangement according to claim 1, wherein, between adjacent active zones and along the beam direction, at least one of a wavelength-selective mirror or a wavelength-selective optical grating are located.

11. The semiconductor laser arrangement according to claim 1, wherein the waveguide structure essentially consists of one or more semiconductor materials.

12. The semiconductor laser arrangement according to claim 1, wherein the semiconductor laser arrangement is free of phosphors and free of optically pumped laser structures.

13. The semiconductor laser arrangement according to claim 1, wherein the semiconductor laser arrangement comprises one active zone for generating blue light, one active zone for generating green light and one active zone for generating red light.

14. The semiconductor laser arrangement according to claim 1, wherein the semiconductor laser arrangement comprises one active zone for generating blue light or ultraviolet radiation and one active zone for generating near-infrared radiation.

15. The semiconductor laser arrangement according to claim 1, wherein for each one of the different emission wavelengths an own plane parallel to a support is present, in which planes the respective radiation is guided, the planes have mutually different distances to the support.

16. A projector for projecting variable color images comprising:
a semiconductor laser arrangement according to claim 1; and
an imaging optical system,
wherein the projector is designed to emit laser radiation having an average luminous flux of at least 10 lm, and
wherein the semiconductor laser arrangement takes a volume of at most 10 mm×3 mm×3 mm in the projector.

* * * * *